United States Patent [19]
Kuji et al.

[11] Patent Number: 5,640,101
[45] Date of Patent: Jun. 17, 1997

[54] PROBE SYSTEM AND PROBE METHOD

[75] Inventors: Motohiro Kuji; Haruhiko Yoshioka, both of Yamanashi-ken; Shinji Akaike, Kofu; Shigeaki Takahashi, Yamanashi-ken, all of Japan

[73] Assignees: Tokyo Electron Limited, Tokyo; Tokyo Electron Yamanashi Limited, Nirasaki, both of Japan

[21] Appl. No.: 634,675

[22] Filed: Apr. 18, 1996

Related U.S. Application Data

[62] Division of Ser. No. 414,590, Mar. 31, 1995.

[30] Foreign Application Priority Data

| Mar. 31, 1994 | [JP] | Japan | 6-085759 |
| Apr. 19, 1994 | [JP] | Japan | 6-104614 |
| Apr. 19, 1994 | [JP] | Japan | 6-104615 |

[51] Int. Cl.$^6$ .............................. G01R 1/067; G01R 1/02
[52] U.S. Cl. .................... 324/754; 324/73.1; 324/690
[58] Field of Search .............................. 324/73.1, 754, 324/690, 458, 537; 358/101, 106, 107

[56] References Cited

U.S. PATENT DOCUMENTS

| 4,929,893 | 5/1990 | Sato et al. | 324/754 |
| 5,091,692 | 2/1992 | Ohno et al. | 324/754 |
| 5,321,352 | 6/1994 | Takebuchi | 324/758 |

FOREIGN PATENT DOCUMENTS

| 1-94631 | 4/1989 | Japan . |
| 1-119036 | 5/1989 | Japan . |
| WO92/08144 | 5/1992 | WIPO . |

OTHER PUBLICATIONS

Patent Abstracts of Japan, vol. 17, No. 625 (E-1461), Nov. 18, 1993, JP-A-5-198662, Aug. 6, 1993.
11th International Electronics Manufacturing Technology Symposium, pp. 429-433, Sep. 16-18, 1991, "Probe for Highly Integrated Multichip Modules", Tomoaki Sakata, et al.

*Primary Examiner*—Kenneth A. Wieder
*Assistant Examiner*—Barry C. Bowser
*Attorney, Agent, or Firm*—Oblon, Spivak, McClelland, Maier & Neustadt, P.C.

[57] ABSTRACT

A probe system tests the electrical characteristics of chips arranged in a matrix on a semiconductor wafer. An XYZ stage movable in the directions of three-dimensional axes is disposed under a probe card having probes to be brought into contact with the electrode pads of the chips. A wafer table rotatable within a horizontal plane is disposed on the XYZ stage. A first image pickup means for picking up the probe images is mounted on the XYZ stage. A second image pickup means for picking up a wafer image is disposed above the table. The second image pickup means is movable horizontally to and from a use position under the probe card. A target is supported and moved by a driving member mounted on the XYZ stage, for aligning the focal points and optical axes of the first and second image pickup means. The target is moved between forward and retreat positions within and outside the field of view of the first image pickup means. At the forward position, the target provides a reference point aligned with the focal point of the first image pickup means. The table, the stage, and the image pickup means are connected to control and processing section which manages the position of the stage based on the three-dimensional coordinate system defined by the pulse count of encoders.

12 Claims, 9 Drawing Sheets

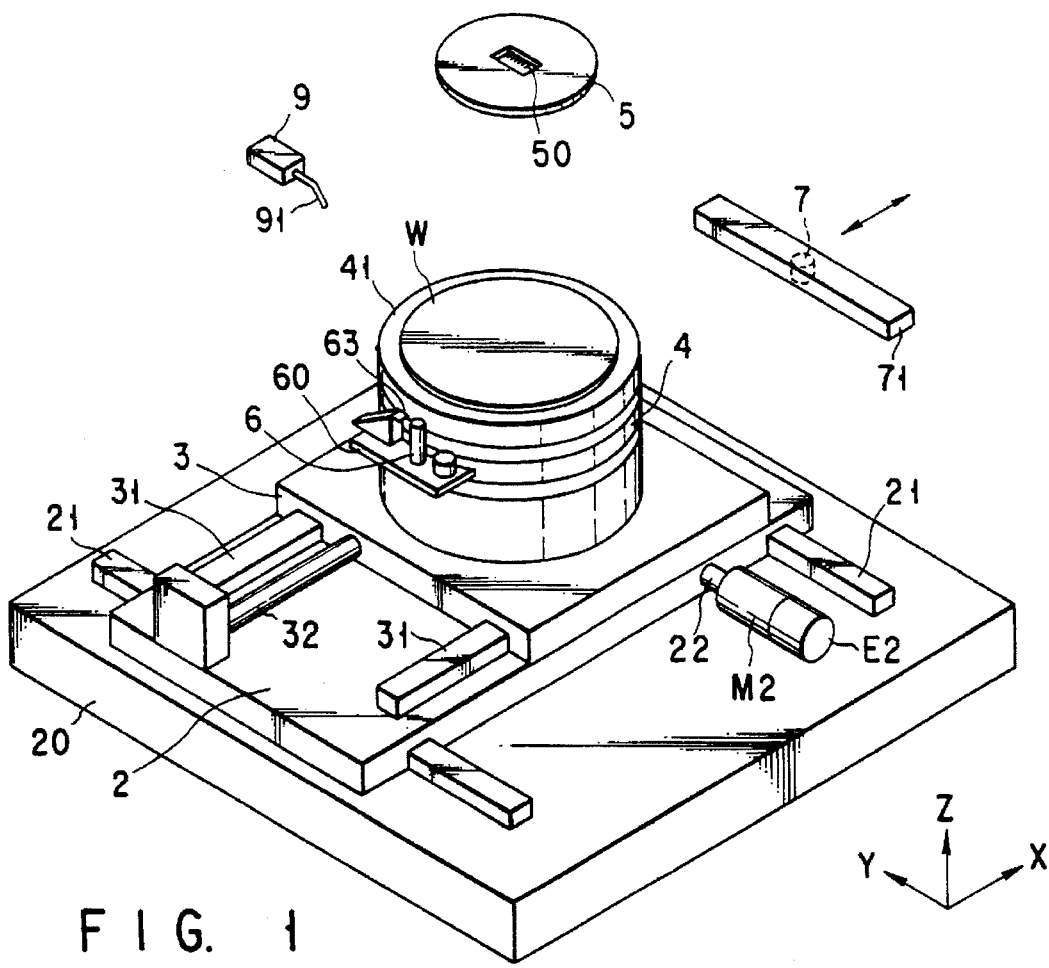
F I G. 1
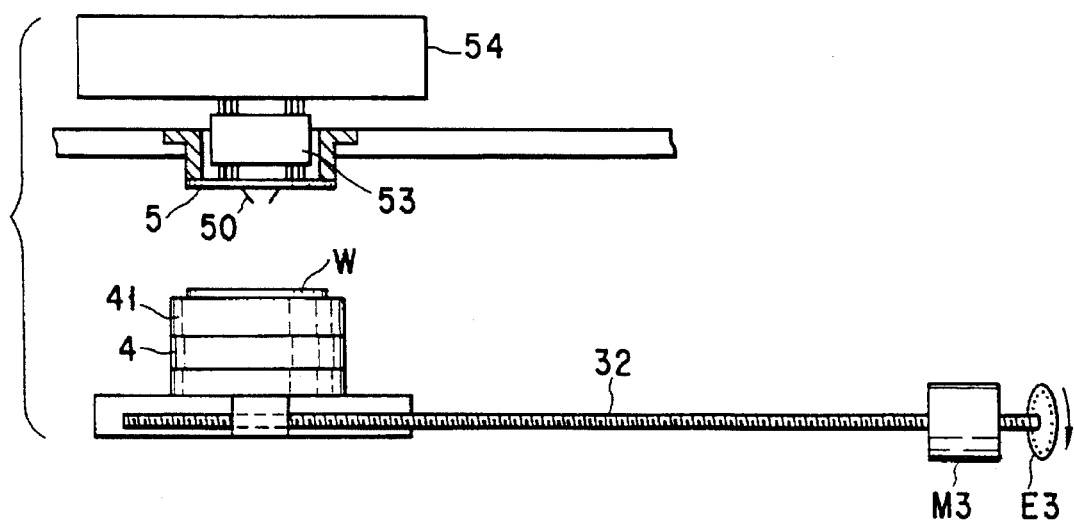
F I G. 2

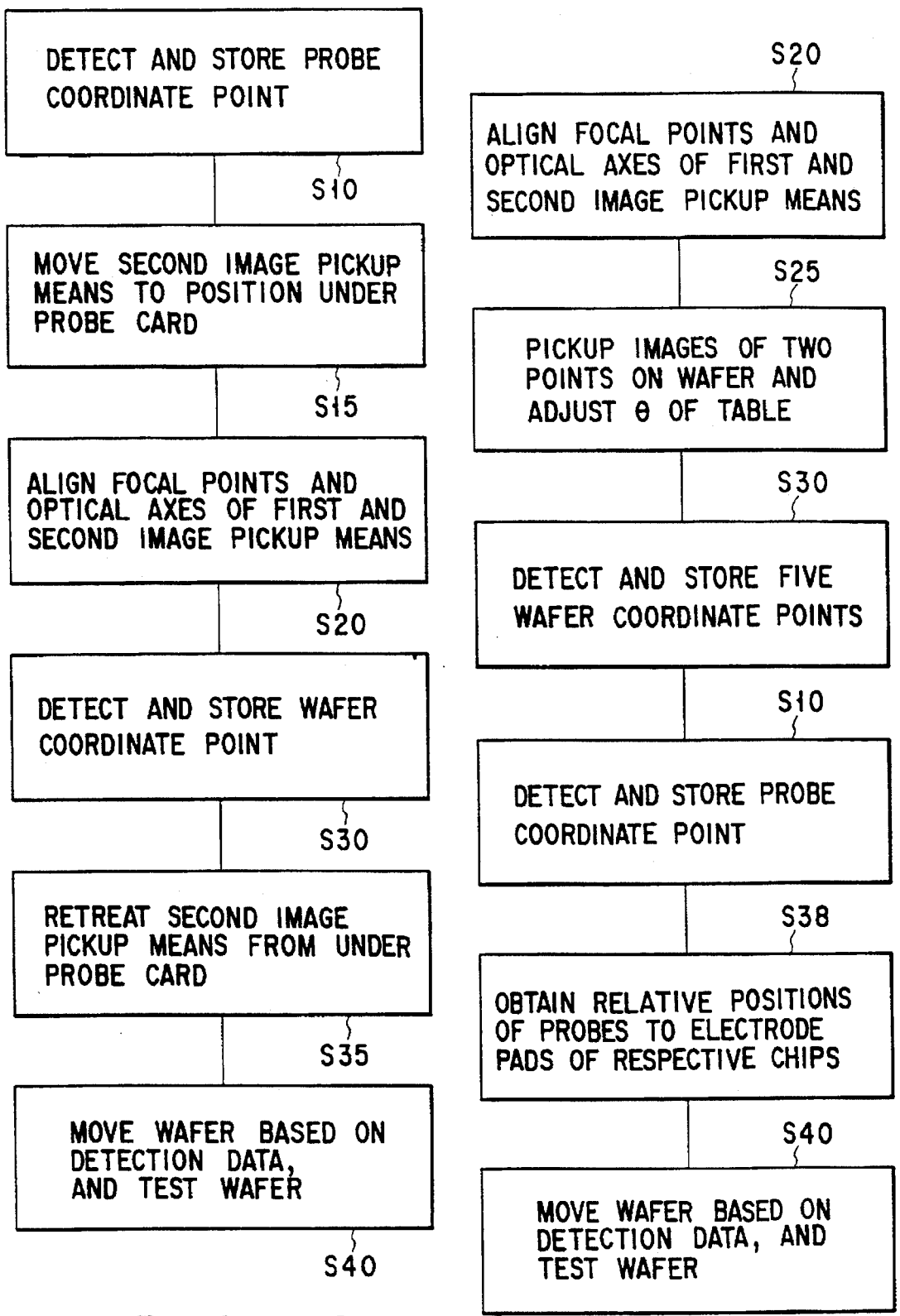

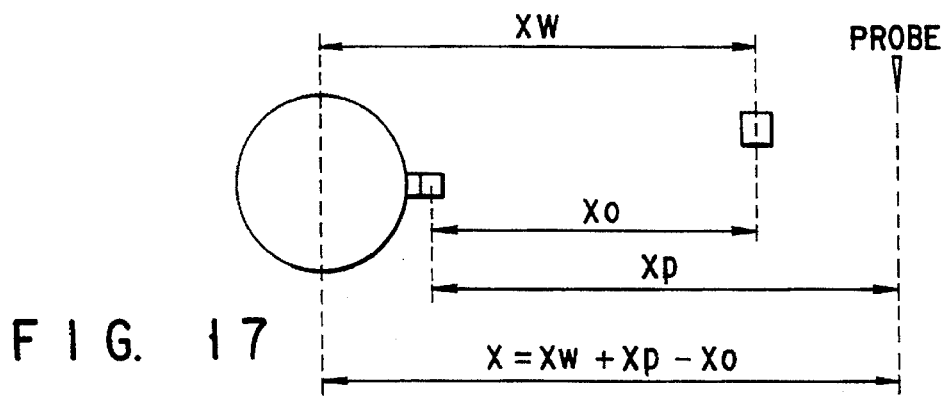
F I G. 17
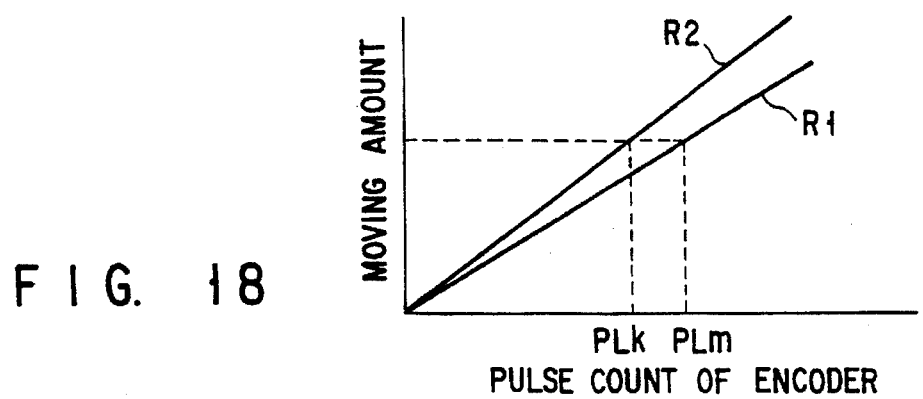
F I G. 18
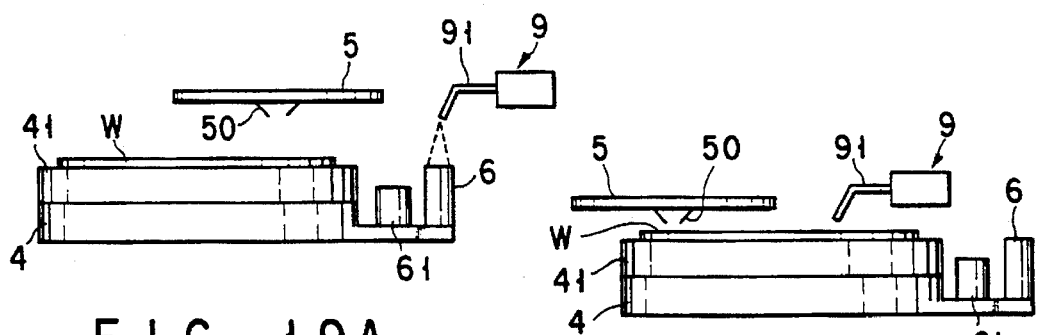
F I G. 19A    F I G. 19B
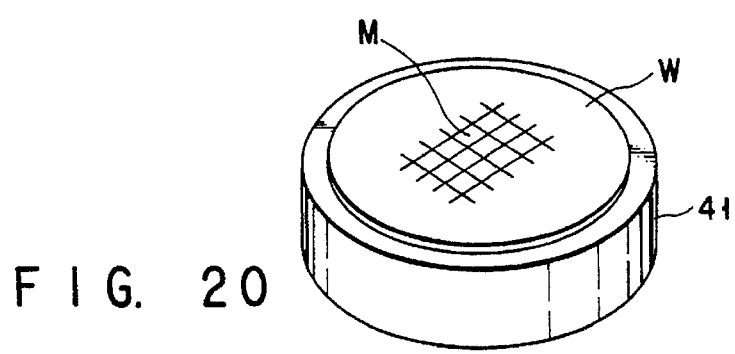
F I G. 20

PROBE SYSTEM AND PROBE METHOD

This is a divisional of pending application Ser. No. 08/414,590 filed on Mar. 31, 1995.

BACKGROUND OF THE INVENTION

1. Field of the Invention

The present invention relates to a probe system for testing the electrical characteristics of a substrate, e.g., a semiconductor wafer or an LCD substrate, while electrically connecting probes to the electrode pads of the substrate.

2. Description of the Related Art

In a probe system, a technique which has a first image pickup means for picking up the image of the distal ends of probes from the wafer side and a second image pickup means for picking up the wafer image from the probe side and which aligns the wafer and the probes by using the first and second image pickup means is described in, e.g., Jpn. Pat. Appln. KOKAI Publication Nos. 1-94631 and 1-119036.

In the conventional probe system, the mounting position of a probe card and the position of an XYZ stage in alignment of a wafer must have absolutely high precision. For example, a position for picking up the image of the wafer and a position for actually testing the substrate are rather separated from each other, and the positional relationship between them is guaranteed only by the XYZ stage.

However, when probes are to be aligned with the electrode pads of a wafer, even when the linearity, the flatness, the orthogonality, and the like of the rails for guiding the XYZ stage are set at high precision, when the temperature changes, a thermal deformation occurs to cause an error. When the temperature changes by, e.g., 10° C., an error of 20 to 30 microns per 100 mm occurs by the thermal expansion and contraction of a ball screw that drives the XYZ stage. An error on the order of microns is also caused by a temperature change in the positional relationship between the probe card connected to the head plate and the image pickup means for picking up the image of the wafer.

Ordinarily, the probe card is exchanged in accordance with the type of the substrate. Every time the probe card is exchanged, its position is displaced due to the gap between the inner diameter of the hollow portion of the head plate and the outer diameter of the probe card. This error also makes it difficult to perform accurate alignment of the probes and the electrode pads of the wafer.

In a conventional typical probe system, an alignment region for picking up the image of the wafer and a probing region under a probe card used for testing the wafer are separated from each other. In this case, the data on the wafer obtained in the alignment region is transferred to the probing region and used. Accordingly, if the state of the three-dimensional coordinate system of the moving mechanism of the table in the alignment region and that in the probing region are the same, the wafer moves in the probing region in the same manner as in the alignment region. In fact, however, the two states differ due to the following reason, thus causing an error in movement of the wafer (movement of IC chips).

More specifically, in the probe system, a probe card having probes aligned to correspond to the electrode pad array of an IC chip on a wafer W is arranged above a wafer table which is movable in the X, Y, Z, and θ directions. The electrode pads of the IC chip are brought into contact with the probes, and the electrical characteristics of the chip are tested by a test head through a contact ring.

In order to perform an accurate electrical test, the probes must be surely brought into contact with the electrode pads. For this purpose, the table must be controlled at high precision, and the electrode pads must be correctly aligned with the probes before measurements. As a large number of circuit components and wires are incorporated in the test head, a wafer image pickup means is arranged at a position remote from the test head, and a portion under this image pickup means is defined as an alignment region for wafer alignment.

The relative positions of the probing and alignment regions with respect to each other, the driving amount of the ball screw, and the like are set such that alignment of the probes and the electrode pads of the chip in the probing region is automatically performed. When the relative positions of the electrode pads and probes are aligned with respect to each other, as the moving distance is already obtained in advance in the alignment region, all the electrode pads are correctly brought into contact with the corresponding probes by moving the table based on the moving distance data.

The equality of the postures and positions of the wafer in the three-dimensional axial directions in the probing and alignment regions is determined by the machining precision of the ball screw between the probing and alignment regions and the influences of yawing (right-to-left shift on the X-Y plane), pitching (to-and-from inclination), and rolling (inclination about the moving axis) of the guides. The equality is also influenced by the expansion and contraction of the ball screw caused by an environmental temperature during the measurement. In addition, it is also influenced by the thermal expansion caused by the frictional heat of the ball screw which is generated when the wafer moves from the alignment region to the probing region. As a result, when the wafer moves from the alignment region to the probing region, the wafer has a posture different from the original posture, e.g., the wafer slightly shifts to the right or left or is inclined forward or backward.

Therefore, the moving pattern of the wafer in the probing region is not completely the same as that anticipated in the alignment region. The operation in the alignment region is based on the premise that the relative positions of the wafer image pickup means and probe card are prefixed with respect to each other. However, the positional relationship between the probe card mounted on the head plate and the image pickup means slightly changes in accordance with a temperature change. Also, a positional error of the probe card occurs, although slight, due to the gap between the probe card mounting portion and the probe card in accordance with the type of the wafer.

Although the errors described above are not very large, they pose a problem as the integration degree of the device increases, like in a transition of the DRAM to 32M and further to 64M, as the size of the electrode pad decreases, and as the number of electrode pads increases. When such an error in position of the wafer (an error in position of an IC chip) occurs, it becomes difficult to correctly bring the probes into contact with all the chips on the wafer, so that high-precision electrical testing cannot be performed.

SUMMARY OF THE INVENTION

It is an object of the present invention to provide a probe system and a probe method which enable high-precision alignment of the probes and the electrodes of the substrate.

According to a first aspect of the present invention, there is provided a probe system for testing electrical characteristics of a plurality of chips arranged in a matrix on a substrate, comprising: a probe card on which a plurality of probes are disposed to be brought into contact with the chips; a tester for exchanging an electrical signal with the chips through the probes; a stage arranged to oppose the probe card and movable in directions of three-dimensional axes; a table which is supported on the stage to be rotatable within a horizontal plane, and adapted to place the substrate thereon; first image pickup means, mounted on the stage such that a field of view thereof faces upward, for picking up images of the probes; second image pickup means, disposed above the table such that a field of view thereof faces downward, for picking up an image of the wafer; a target used for aligning focal points and optical axes of the first and second image pickup means; driving means, mounted on the stage, for supporting and moving the target, the target being moved between a forward position and a retreat position within and outside the field of view of the first image pickup means, and, upon being set at the forward position, the target providing a reference point, which is aligned with the focal point of the first image pickup means; and a control and processing section connected to the table, the stage, and the first and second image pickup means, so as to control operations thereof, and to process and store signals therefrom, the control and processing section serving to recognize a position of the stage in the directions of the three-dimensional axes based on a three-dimensional coordinate system defined by operation signals exchanged between the control and processing section and the stages.

According to a second aspect of the present invention, there is provided a probe method in the probe system according to the first aspect, comprising: a probe image pickup step of capturing a specific portion of the probes within the field of view of the first image pickup means and setting the specific portion to coincide with the focal point of the first image pickup means, and storing a position of the stage obtained at this time, as a probe coordinate point of the specific portion of the probes in the three-dimensional coordinate system, in the control and processing section; an aligning step of arranging the target at the forward position, causing the focal points and optical axes of the first and second image pickup means to coincide with each other through the reference point, and storing a position of the stage obtained at this time, as a reference coordinate point of the focal points of the first and second image pickup means in the three-dimensional coordinate system, in the control and processing section, the second image pickup means being located at a use position in the aligning step; a wafer image pickup step of capturing a first specific portion of the wafer within the field of view of the second image pickup means and setting the first specific portion to coincide with the focal point of the second image pickup means, and storing a position of the stage obtained at this time, as a first coordinate point of the first specific portion of the wafer in the three-dimensional coordinate system, in the control and processing section, the second image pickup means being located at the use position in the wafer image pickup step; and a test step of calculating a necessary moving amount of the stage by the control and processing section from the probe coordinate point, the reference coordinate point, and the first coordinate point, bringing the chips into contact with the probes by operating the stage based on the calculated moving amount, thereby testing electrical characteristics of the chips.

According to a third aspect of the present invention, there is provided a method of detecting a coordinate point of a chip in a probe system for testing electrical characteristics of a plurality of chips arranged in a matrix on a substrate, the system comprising: a probe card on which a plurality of probes are disposed to be brought into contact with the chips; a tester for exchanging an electrical signal with the chips through the probes; a stage arranged to oppose the probe card and movable in directions of two-dimensional axes; a table which is supported on the stage to be rotatable within a horizontal plane, and adapted to place the substrate thereon; image pickup means, disposed above the table such that a field of view thereof faces downward, for picking up an image of the wafer; a target having a reference point to be aligned with an optical axis of the image pickup means and mounted on the stage; and a control and processing section connected to the table, the stage, and the image pickup means, so as to control operations thereof, and to process and store signals therefrom, the control and processing section serving to recognize a position of the stage in the directions of the two-dimensional axes based on a two-dimensional coordinate system defined by operation signals exchanged between the control and processing section and the stages, and the method comprising: a step of inputting a design map of the matrix of the chips in the control and processing section; an aligning step of aligning the optical axis of the image pickup means with the reference point, and storing a position of the stage obtained at this time, as a reference coordinate point of the optical axis of the image pickup means in the two-dimensional coordinate system, in the control and processing section, the image pickup means being located at a use position in the aligning step; a wafer image pickup step of moving the stage by the control and processing section based on the design map, capturing first and second specific portions of the wafer within the field of view of the image pickup means, setting the first and second specific portions to coincide with the optical axis of the image pickup means, and storing positions of the stage obtained at these time, as first and second coordinate points of the first and second specific portions of the wafer in the two-dimensional coordinate system, in the control and processing section, the second image pickup means being located at the use position in the wafer image pickup step, and the first and second specific portions comprising portions not being located at the center of the matrix of the chips and having identical positional relationship with first and second chips that do not belong to the same column or row of the matrix; and a step of calculating, by the control and processing section, coordinate points of a chip located between a third chip, located on an intersection of the row and column of the first and second chips, and the first chip, and of a chip located between the third and second chips, in the two-dimensional coordinate system based on the first and second coordinate points in accordance with proportional distribution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic perspective view showing the entire arrangement of a probe system according to an embodiment of the present invention;

FIG. 2 is a schematic side view showing the relationship among the X-direction ball screw, the wafer table, and the probe card of the probe system shown in FIG. 1;

FIG. 10 is a flow chart showing an embodiment of a method according to the present invention;

FIG. 13 is a flow chart for explaining another embodiment of the method according to the present invention;

FIG. 17 is a view showing the relationship among the reference coordinate point for alignment of the first and second image pickup means, the wafer coordinate point, and the probe coordinate point;

FIG. 18 is a graph showing the relationship between the pulse count of an encoder and the moving amount;

FIGS. 19A and 19B are schematic side views showing a method of detecting a marker coordinate point and performing marking; and FIG. 20 is a perspective view showing a state wherein a mark is formed on the wafer.

DETAILED DESCRIPTION OF THE PREFERRED EMBODIMENTS

Figure 3:
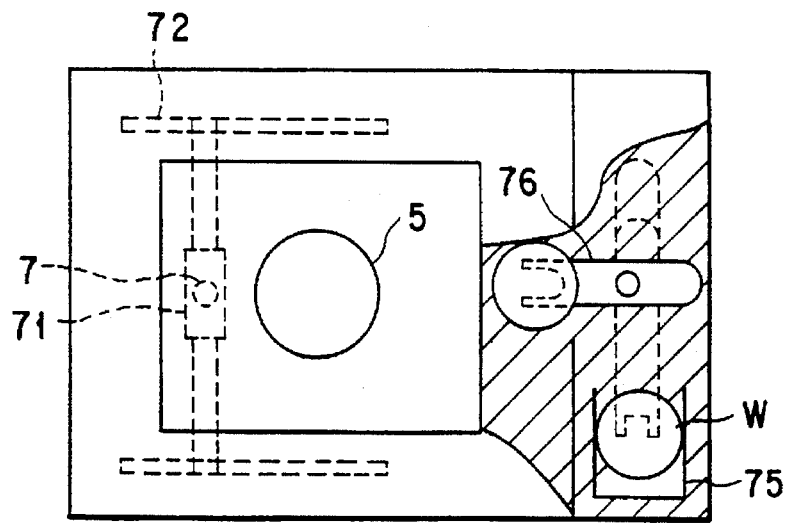
FIG. 3 is a schematic plan view of the probe system shown in FIG. 1.

In the probe system shown in FIG. 1, a Y stage 2 is provided on a base 20 and is driven by a ball screw 22 in the Y direction along guide rails 21 extending in the Y direction. An X stage 3 is provided on the Y stage 2 and is driven by a ball screw 32 in the X direction along guide rails 31 extending in the X direction. Reference symbol M2 denotes a motor for driving the Y-direction ball screw 22; and E2, an encoder combined with the motor M2. The relationship among the X-direction ball screw 32, and an associated motor M3 and encoder E3 is as shown in FIG. 2.

A Z moving unit 4 which is driven by a motor (not shown) in the Z direction is provided to the X stage 3. A wafer table 41 rotatable about the Z axis (movable in the $\theta$ direction) is provided to the Z moving unit 4. In this embodiment, the Z moving unit 4 corresponds to an XYZ stage. Accordingly, the table 41 can move in the X, Y, Z, and θ directions.

Figure 4:
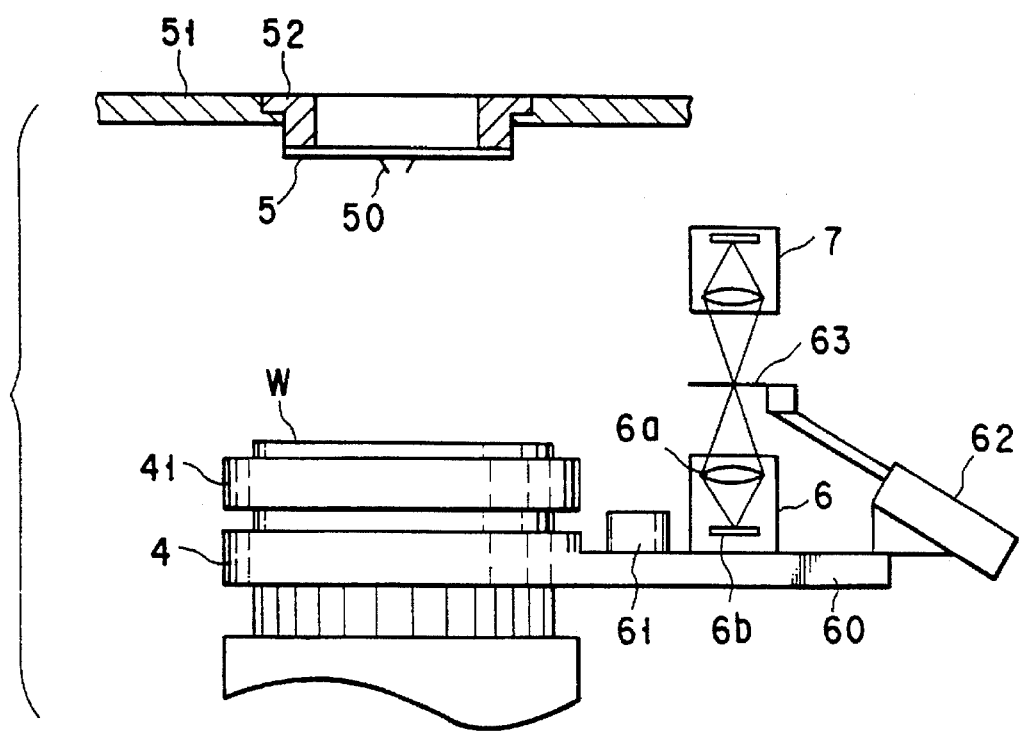
FIG. 4 is a schematic side view showing the main part of the probe system shown in FIG. 1.
Figure 5:
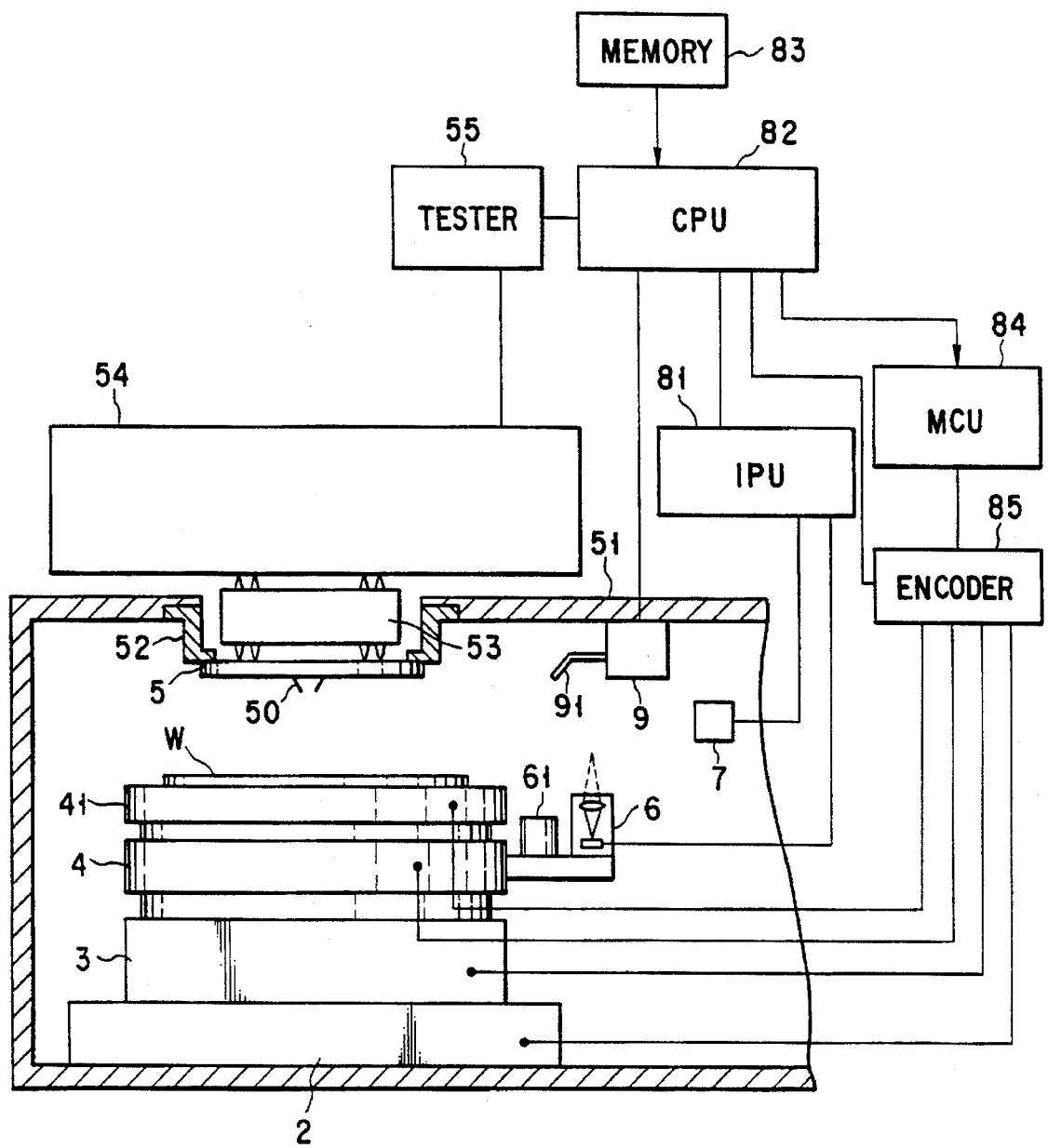
FIG. 5 is a block diagram showing the control system of the probe system shown in FIG. 1.

A probe card 5 is disposed above the table 41, as shown in FIGS. 1, 4, and 5. The probe card 5 is mounted on a head plate 51 corresponding to the ceiling of the housing of the probe system through an insert ring 52. A test head 54 is provided on the head plate 51 through a contact ring 53. The test head 54 is connected to a tester 55. The tester 55 has a data storage unit for storing measurement data based on an electrical signal transmitted from the probe card 5, a determination unit for measuring the non-defectiveness/defectiveness of an IC chip as a measurement target based on the measurement data, and the like.

The probe card 5 has, on its upper side, a plurality of electrodes electrically connected to the test head 54. The probe card 5 also has, on its lower side, a plurality of probes, e.g., probes 50 which are made of metal wires extending obliquely downward, and correspond to the electrode pads of a wafer W. The probes 50 are respectively electrically connected to the electrodes on the upper side of the probe card 5. The probe card may be a vertical needle type probe card having vertical needles (wire probes) extending perpendicularly to the surface of the wafer W, a membrane type probe card having, as probes, gold bump electrodes formed on a flexible film, or the like.

As shown in FIG. 4, a first image pickup means 6 having a vertical optical axis and an upward field of view is fixed to the XYZ table 4, which moves the table 41 vertically, through a stationary plate 60. The position of the stationary plate 60 in FIG. 4 is slightly different from that in FIG. 1 for the sake of illustrative convenience. The first image pickup means 6 is formed by combining a high-magnification optical system 6a and a CCD camera 6b so that it can pickup an enlarged image of the needle point of a probe 50. A low-magnification camera 61 for picking up an image of the array of the probes 50 in a wide range is fixed on the stationary plate 60 to be adjacent to the first image pickup means 6.

A target 63 is provided to the stationary plate 60 such that it can be linearly moved by a piston cylinder 62 forward toward or backward from the field of view of the first image pickup means 6. The target 63 is formed such that it can be optically recognized, i.e., image-recognized, by the first image pickup means 6 and a second image pickup means 7. For example, the target 63 is formed by depositing a circular metal film having a diameter of, e.g., 140 μm, and serving as an object for alignment, on a transparent glass plate.

The second image pickup means 7, has a vertical optical axis and a downward field of view, includes a CCD camera and an optical unit, mounted on a movable body 71, and is provided in the region between the table 41 and the probe card 5 to be movable in the X direction along guides 72 (see FIG. 3). As shown in FIG. 3, a wafer cassette 75 is arranged to be adjacent to the moving range of the table 41. A wafer is exchanged between the table 41 and the wafer cassette 75 by a convey arm 76. A marker 9 for marking a defective chip is disposed on a side of the head plate 51. The marker 9 has a nozzle 91 for applying an ink onto the wafer W.

The outline of the control and processing section of the probe system is shown in FIG. 5. The control and processing section has, e.g., an image processing unit (IPU) 81, a central processing unit (CPU) 82, a memory 83, a motor control unit (MCU) 84, and the like. For example, the image processing unit 81 fetches images obtained by the first and second image pickup means 6 and 7, compares the fetched image signals with image data stored in the internal memory of the image processing unit 81 or in the memory 83, and determines whether or not the focal points of the first image pickup means 6 and 7 are aligned.

For example, the central processing unit 82 obtains data indicating the position coordinate point of the Z moving unit (XYZ stage) 4 (a coordinate point in the three-dimensional coordinate system of the control and processing section) based on a pulse signal sent from encoders 85 mounted on X-, Y-, and Z-direction motors for driving the table 41 and stores the obtained data in the memory 83, arithmetically processes the position data in the memory 83, and controls the X-, Y-, and Z-direction motors by supplying control signals to the motor control unit 84. The central processing unit 82 executes these processing operations in accordance with a predetermined program.

More specifically, the central processing unit 82 recognizes the position of the XYZ stage 4 in the horizontal and vertical directions based on the three-dimensional coordinate system defined by the operation signal of the XYZ stage 4. This operation signal is exchanged between the central processing unit 82 and the motor control unit 84. To be more concrete, the three-dimensional coordinate system of the XYZ stage 4 is a coordinate system which is defined by the pulse counts of the encoders 85 in the X, Y, and Z directions. Accordingly, a coordinate point of the XYZ stage 4 (wafer table 41) in a certain state is expressed by the pulse counts of the encoders 85 in the X, Y, and Z directions with respect to an arbitrary reference obtained when the XYZ stage 4 is set at a certain position.

FIGS. 6A to 6D show the operation of the target 63 in detail.

Figure 6A:
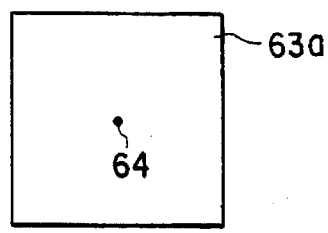
FIGS. 6A to 6D are views showing in detail the target of the probe system shown in FIG. 1.
Figure 6B:
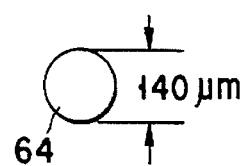

The target 63 is formed such that its image can be recognized by the first and second image pickup means 6 and 7. For example, as shown in FIGS. 6A and 6B, the target 63 is formed by depositing a circular metal film 64 having a diameter of 140 μm and a thickness of about 10 nm on a transparent glass plate 63a.

Figure 6C:
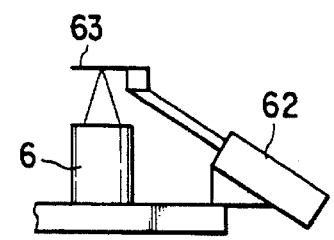

As shown in FIG. 6C, when the target 63 is driven by the piston cylinder 62 to come to its forward position, the center of the metal film 64, i.e., its reference point is set to coincide with the focal point of the first image pickup means 6.

Figure 6D:
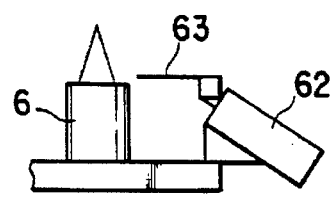

As shown in FIG. 6D, when the target 63 is driven by the piston cylinder 62 to return to its retreat position, the target 63 falls outside the field of view of the first image pickup means 6. Thus, when the XYZ stage 4 is moved such that the distal end of a reference probe 50 coincides with the focal point of the first image pickup means 6, the coordinates of the distal end of the reference probe 50 in the three-dimensional coordinate system can be obtained.

As shown in FIG. 6C, the target 63 can always be projected to above the first image pickup means 6 with a good reproducibility of, e.g., 1 to 2 microns. In this state, when the XYZ stage 4 is moved such that the metal film 64 of the target 63 coincides with the focal point of the second image pickup means 7, the coordinates of the focal point of the second image pickup means 7 in the three-dimensional coordinate system can be obtained.

As shown in FIG. 6D, when the target 63 is retreated from the position above the first image pickup means 6 and the XYZ stage 4 is moved such that the reference electrode pad of a certain chip on a predetermined wafer W coincides with the focal point of the second image pickup means 7, the coordinates of the reference electrode pad in the three-dimensional coordinate system can be obtained.

More specifically, the probe method according to the present invention has, as major steps, a probe image pickup step (S10), an aligning step (S20), a wafer image pickup step (S30), and a final test step (S40).

In the probe image pickup step S10, a specific portion of the probes 50, e.g., the distal end of a reference probe 50, is captured within the field of view of the first image pickup means 6. This specific portion of the probes 50 is set to coincide with the focal point of the first image pickup means 6. The position of the XYZ stage 4 at this time is defined as the probe coordinate point of the specific portion of the probes 50 in the three-dimensional coordinate system of the XYZ stage 4.

In the aligning step S20, the target 63 is set at the forward position, and the reference point of the target 63 is set to coincide with the focal point of the second image pickup means 7. The position of the XYZ stage 4 at this time is defined as the reference coordinate point of the focal point of the second image pickup means 7 in the three-dimensional coordinate system of the XYZ stage 4. In the aligning step S20, the second image pickup means 7 is arranged at a use position, e.g., a position below the probe card 5.

In the wafer image pickup step S30, the specific portion of the wafer, e.g., the reference electrode pad of the first chip, is captured within the field of view of the second image pickup means 7, and the specific portion of the wafer is set to coincide with the focal point of the second image pickup means 7. The position of the XYZ stage 4 at this time is defined as the wafer coordinate point of the specific portion of the wafer in the three-dimensional coordinate system of the XYZ stage 4. In the wafer image pickup step S30, the second image pickup means 7 is arranged at the same position as in the aligning step S20, i.e., at the use position described above.

In the test step S40, a necessary moving amount of the XYZ stage 4 is calculated by the control and processing section 81 to 84 from data of the probe coordinate point, the reference coordinate point, and the wafer coordinate point. The XYZ stage 4 is operated based on the calculated result to cause the first chip and the probes into contact with each other and to measure the electrical characteristics of the first chip.

Preferable probe image pickup step S10, aligning step S20, and wafer image pickup step S30 will be described below in more detail.

As described above, the target 63 is set such that when it is at the forward position above the first image pickup means 6, its reference point (more specifically, the center, i.e., the reference point and at the same time the center of the film thickness of the metal film 64) coincides with the focal point of the first image pickup means 6.

Figure 7A:
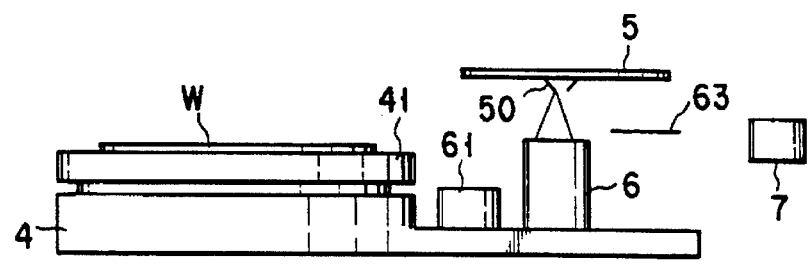
FIGS. 7A to 7C are schematic side views respectively showing a probe image pickup step, an image pickup means aligning step, and a wafer image pickup step.
Figure 8A:
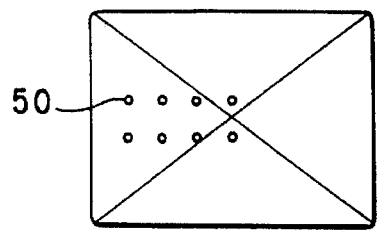
FIGS. 8A and 8B are views showing screens obtained by image signals sent from a first image pickup element in the probe image pickup step.
Figure 8B:
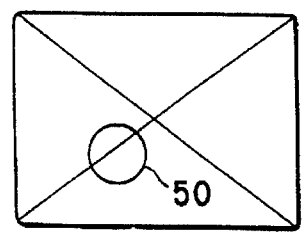

In the probe image pickup step S10, however, as shown in FIG. 7A, the target 63 is set at the retreat position outside the field of view of the first image pickup means 6, and the first image pickup means 6 is moved by the XYZ stage 4 to reach a portion under the reference probe 50, the position of which is roughly known in advance. The first image pickup means 6 performs search so that its field of view captures the probe 50, and the position where the first image pickup means 6 captures the probe 50 is image-recognized by the first image pickup means 6. More specifically, an image pickup operation is performed in a wide range in the low magnification mode first as shown in FIG. 8A, and thereafter in a narrow range in the high magnification mode as shown in FIG. 8B.

The position of the image-recognized probe 50 is set at the center of the screen, i.e., at the focal point of the first image pickup means 6. As a result, the position of the XYZ stage 4 obtained when the probe 50 is captured at the center of the screen is defined as a probe coordinate point (Xp,Yp,Zp) of the reference probe 50 in the three-dimensional coordinate system of the XYZ stage 4, and is stored in the memory 83. The schematic position data of the reference probe 50 necessary for automatically moving the XYZ stage 4 can be obtained by storing the design map of the probe card 5 in the memory 83 in advance.

Figure 7B:
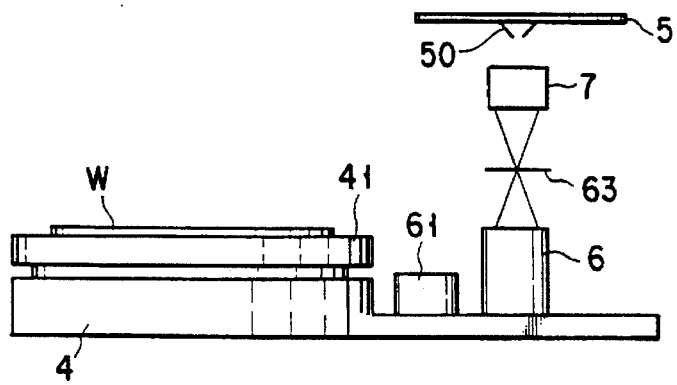

In the aligning step S20, the second image pickup means 7 is moved to a portion under the probe card 5, as shown in FIG. 7B. When the aligning step S20 is to be executed subsequent to the probe image pickup step S10, it is preferable to keep the XYZ stage 4 fixed in position and to move only the second image pickup means 7. The target 63 is arranged at the forward position above the first image pickup means 6 with a good reproducibility. When the metal film 64 (more specifically, the center, i.e., the reference point and at the same time the center of the thickness of the metal film 64) of the target 63 is set to coincide with the focal point of the second image pickup means 7 by image recognition, the first image pickup means 6, the target 63, and the second image pickup means 7 can be aligned with each other.

At this time, the focal points and optical axes of the first and second image pickup means 6 and 7 are aligned. The position of the XYZ stage 4 obtained at this time is defined as the reference coordinate point (X0,Y0,Z0) of the focal points of the first and second image pickup means 6 and 7 in the three-dimensional coordinate system of the XYZ stage 4, and is stored in the memory 83. After this alignment, the target 63 above the first image pickup means 6 is retreated from the field of view of the first image pickup means 6.

Figure 7C:
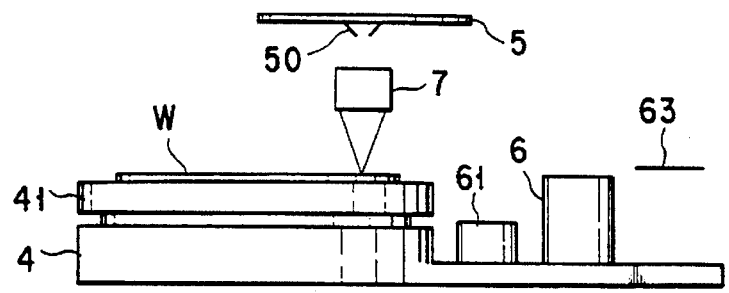
Figure 9A:
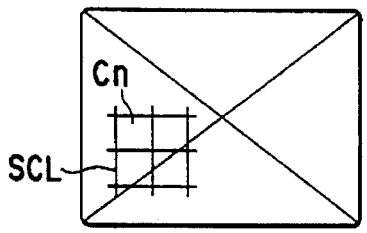
FIGS. 9A and 9B are views showing screens obtained by image signals sent from a second image pickup element in the wafer image pickup step.
Figure 9B:
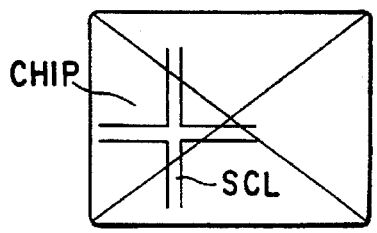

In the wafer image pickup step S30, first, the XYZ stage 4 is driven so that a chip Cn, whose image is to be picked up, of the wafer W or a gap SCL between chips reaches a portion under the second image pickup means 7. Furthermore, search is performed such that the field of view of the second image pickup means 7 captures the chip Cn or the gap SCL, and the position where the second image pickup means 7 captures the chip Cn or the gap SCL is image-recognized by the second image pickup means 7. More specifically, an image pickup operation is performed in a wide range in the low magnification mode first, as shown in FIG. 9A, and thereafter in a narrow range in the high magnification mode, as shown in FIG. 9B. Alignment is performed by image recognition such that, for example, a reference electrode pad corresponding to the reference probe 50 coincides with the focal point of the second image pickup means 7, as shown in FIG. 7C.

The position of the reference electrode pad which is image-recognized is set at the center of the screen, i.e., at the focal pint of the second image pickup means 7. As a result, the position of the XYZ stage 4 obtained when the reference electrode pad is captured at the center of the screen is defined as a wafer coordinate point (Xw,Yw,Zw) of the reference electrode pad in the three-dimensional coordinate system of the XYZ stage 4, and is stored in the memory 83. The schematic position data of the reference electrode pad necessary for automatically moving the XYZ stage 4 can be obtained by storing the design map of the chips in the memory 83 in advance.

When the probe coordinate point (Xp,Yp,Zp), the reference coordinate point (X0,Y0,Z0), and the wafer coordinate point (Xw,Yw,Zw) are obtained in this manner, a moving amount required for moving the XYZ stage 4 to a position where the reference electrode pad and the reference probe are brought into contact with each other is calculated by the control and processing section 81 to 84. Assuming that the moving amounts in X, Y, and Z directions are respectively $\underline{x}$, $\underline{y}$, and $\underline{z}$, these moving amounts are expressed as x=Xw+Xp−X0, y=Yw+Yp−Y0, and z=Zw+Zp−Z0. The distance between the probe and the wafer in the Z direction is obtained from the vertical moving amount of the XYZ stage 4 obtained when the probe image is picked up and that obtained when the wafer image is picked up, with reference to the height of the XYZ stage 4 obtained when the focal points of the image pickup means 6 and 7 are aligned with each other.

The order of the probe image pickup step S10, the aligning step S20, and the wafer image pickup step S30 can be freely changed, while the test step S40 always comes to the last. More specifically, the order of the steps S10 to S40 has six cases as follows:

(1) In the order of step S10, step S20, step S30, and step S40.

(2) In the order of step S10, step S30, step S20, and step S40.

(3) In the order of step S20, step S30, step S10, and step S40.

(4) In the order of step S30, step S20, step S10, and step S40.

(5) In the order of step S20, step S10, step S30, and step S40.

(6) In the order of step S30, step S10, step S20, and step S40.

Furthermore, when the reference point of the target 63 is set to coincide with the focal point of the second image pickup means 7 and when the focal point of the second image pickup means 7 is set to coincide with the specific portion of the wafer, the use position of the second image pickup means 7 is preferably located below the probe card 5. Accordingly, step S15 of moving the second image pickup means 7 to the use position below the probe card 5 and step S35 of retreating the second image pickup means 7 from the use position below the probe card 5 can be added to the three steps S10 to S40 described above.

In this case, in the aligning step S20 and the wafer image pickup step S30, the second image pickup means 7 must be located at the same use position, and in the probe image pickup step S10 and the test step S40, the second image pickup means 7 must have been retreated from the use position. More specifically, since a high reproducibility of the use position of the second image pickup means 7 cannot be obtained with an ordinary driving mechanism, it is not realistic to interpose step S10 between steps S20 and S30, and steps S20 and S30 are always executed continuously. In other words, when the steps S15 and S35 are included, only the orders (1) to (4) are appropriate, and the orders (5) and (6) are inappropriate. Step S15 is executed before steps S20 and S30, and step S35 is executed after steps S20 and S30. That is, the order of steps S10 to S40 has four cases as follows. FIG. 10 shows the flow chart of the order (7).

(7) In the order of step S10, step S15, step S20, step S30, step S35, and step S40.

(8) In the order of step S10, step S15, step S30, step S20, step S35, and step S40.

(9) In the order of step S15, step S20, step S30, step S35, step S10, and step S40.

(10) In the order of step S15, step S30, step S20, step S35, step S10, and step S40.

A method of obtaining correction data by using the coordinate points of a plurality of specific portions, e.g., of a plurality of chips in the wafer image pickup step S30 will be described.

Figure 11A:
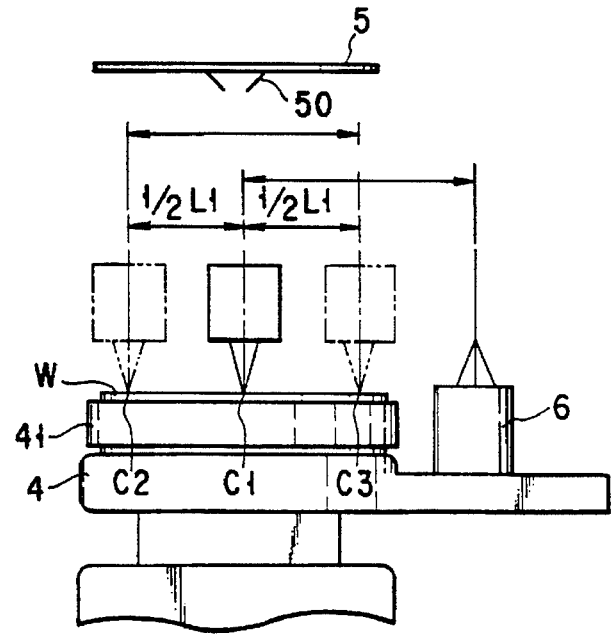
FIGS. 11A and 11B are views for explaining a method of picking up images of a plurality of chips in the wafer image pickup step.
Figure 11B:
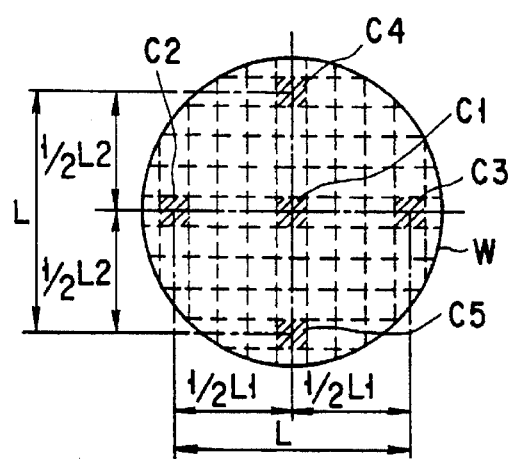

Note that a chip C1 at substantially the center of the chip matrix arranged on the wafer w, chips C2 and C3 at substantially the two end portions of a row including the chip C1, and chips C4 and C5 at substantially the two end portions of a column including the chip C1, as shown in FIGS. 11A and 11B, are considered. The chips C2 and C3 are located at positions of an equal distance, e.g., ½L1, from the chip C1. The chips C4 and C5 are located at positions of an equal distance, e.g., ½L2, from the chip C1.

Figure 12:
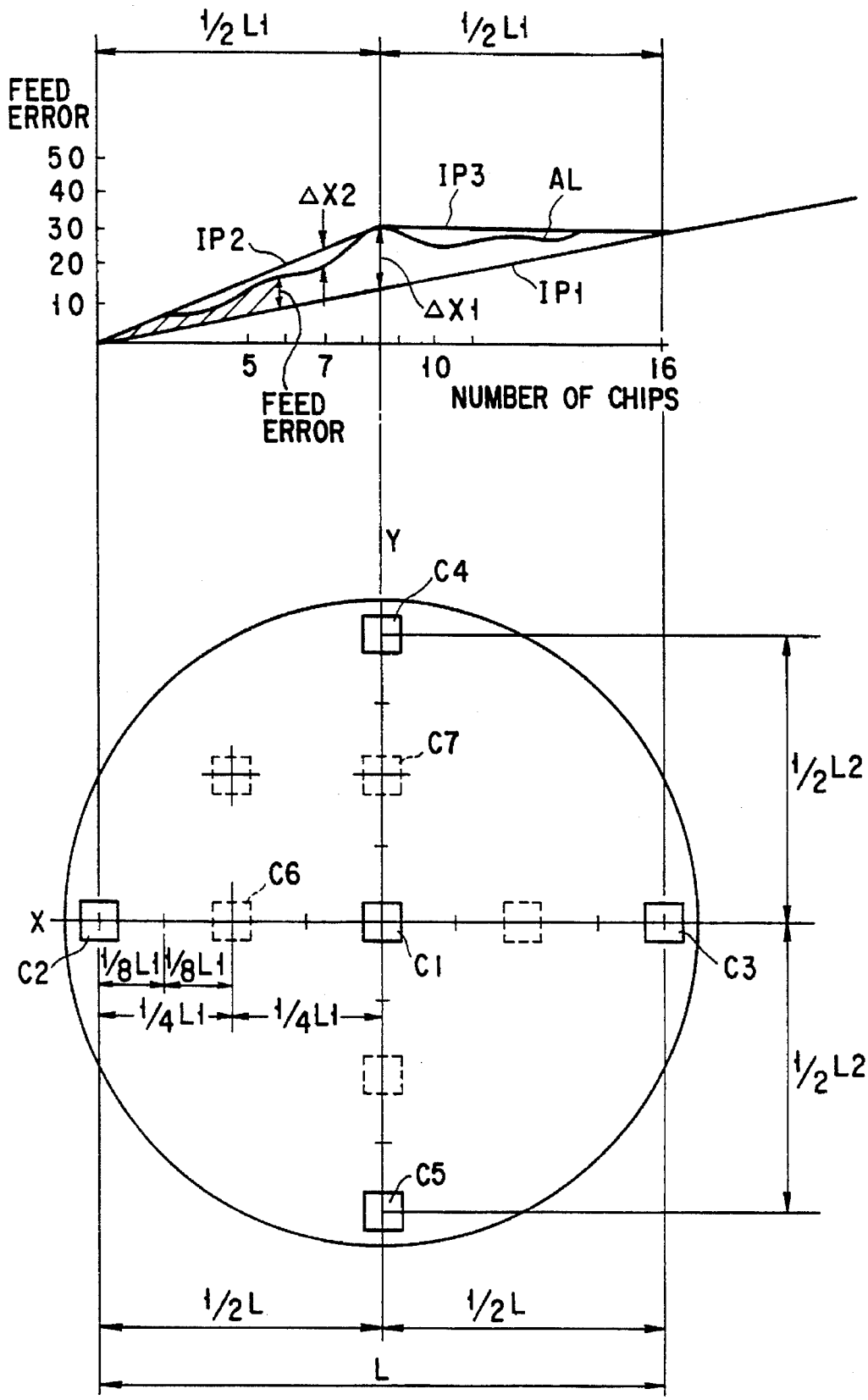
FIG. 12 is a view for further explaining the method shown in FIGS. 11A and 11B.

As shown in FIG. 12, the X coordinate of an intermediate chip can be calculated from an interpolation line IP1 obtained by actually measuring the X coordinates of the chips C2 and C3. In this case, when the X coordinate of the intermediate chip is calculated in accordance with proportional distribution, a maximum positional error $\Delta x1$ occurs in, e.g., the chip C1, in the X direction from a line AL which is based on the actual movement of the XYZ stage 4. Meanwhile, noting the chip C1 between the chips C2 and C3, the x coordinate of an intermediate chip can be calculated by an interpolation line IP2 obtained by actually measuring the X coordinates of the chips C2 and C1. In this case, when the X coordinate of the chip is calculated in accordance with proportional distribution, a maximum positional error $\Delta x2$ occurs in, e.g., the seventh chip. However, it is generally known that $\Delta x2 < \Delta x1$. Similarly, when the X coordinate of an intermediate chip is calculated from an interpolation line IP3 obtained by actually measuring the X coordinates of the chips C2 and C1, the maximum error is smaller than $\Delta x1$.

More specifically, the position of a chip which is not actually measured can be obtained more accurately in accordance with proportional distribution by actually measuring three chips. This applies to the chips C1, C4, and C5 in the Y-axis direction. In this manner, accurate correction data necessary for correcting the design map of the chip matrix, which has been input to the memory 83 in advance, and concerns the current error characteristics (size, feed amount, and the like) of this probe system can be obtained. If the chip matrix is substantially symmetric in the vertical and horizontal directions, the correction data can be obtained only by actually measuring three chips, i.e., a chip located at the intersection of intersecting row and column, a chip preferably located near an end portion of this row, and a chip preferably located near an end portion of this column, just like the chips C1, C2, and C3. Regarding a chip located at the intersection of intersecting row and column, if the information of the design map is used as it is, the correction data can be obtained only by actually measuring two chips, i.e., a chip preferably located near an end portion of this row and a chip preferably located near an end portion of this column.

Regarding the procedure of actual measurement, the position of an electrode pad corresponding to the reference probe 50 of the chip C1 at the center of the wafer is actually measured first. In this actual measurement, the magnification of the second image pickup means 7 is switched to perform micro and macro image pickup operations, thereby performing image recognition. Subsequently, the positions of, e.g., the chips C2 and C4 are actually measured, and correction data of an area ¼ the wafer W surrounded by the chips C1, C2, and C4 is obtained. When the correction data of the map concerning the current error characteristics of this probe system is obtained for each ¼ area in this manner, high-precision alignment of the probes and the electrode pads can be performed.

In addition, if correction data is obtained with the above method for a smaller wafer test area, e.g., a square portion with sides each having a length of ¼ L and surrounded by a chip C6, the chip C1, and a chip C7, higher-precision alignment can be performed.

In the probe system shown in FIG. 1, a method of performing a test by picking up images of a plurality of specific portions of the wafer will be described in more detail with reference to FIG. 13. This method will be described based on the premise that the respective steps are executed in the order (3) of step S20, step S30, step S10, and S40 described above.

First, the wafer W is extracted from the wafer cassette 75 by the convey arm 76 and conveyed to the table 41. The second image pickup means 7 is located below the probes 50, and the target 63 is projected as shown in FIG. 7B. The XYZ stage 4 is moved such that the focal point of the second image pickup means 7 coincides with the metal film 64 of the target 63 and that the center, i.e., the reference point, of the metal film 64 and the optical axis of the second image pickup means 7 coincide with each other.

Position control of the XYZ stage 4 is performed by locating the first image pickup means 6 below a stop position of the second image pickup means 7 and moving the XYZ stage 4 in the X, Y, and Z directions while comparing the image data stored in the image memory in advance with the image data obtained by the second image pickup means 7. Since the focal point and the optical axis of the first image pickup means 6 coincide with the reference point of the target 63, the focal points and the optical axes of the two image pickup means 6 and 7 coincide with each other. The coordinate point of the XYZ coordinate system of the XYZ stage 4 at this time, i.e., of the three-dimensional coordinate system, is stored as the reference coordinate point (X0,Y0, Z0) in the memory 83 (FIG. 13, step S20).

Figure 14:
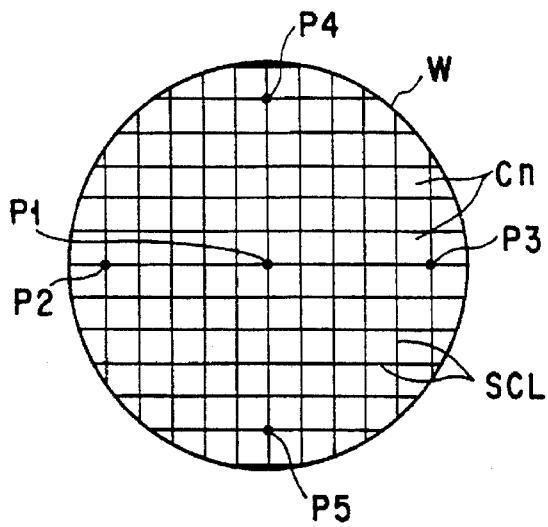
FIG. 14 is a plan view showing the positions of five points when their coordinate points are obtained by picking up images of the five points on the wafer.

Subsequently, the target 63 is retreated from above the first image pickup means 6, as shown in FIG. 7C, the table 41 is located below the second image pickup means 7 and, e.g., images of five points on the wafer W are picked up. As shown in FIG. 14, the five points are the specific portions corresponding, of the IC chips on the wafer W, to the central chip C1, the chips C2 and C3 near the two end portions of the chip row on which the chip C1 is located, and the chips C4 and C5 near the two end portions of the chip column on which the chip C1 is located, as described above. The positional relationship among the respective specific portions corresponding to the respective chips is identical to that among the respective chips.

In order to pick up images of these points P1 to P5 and to obtain their position data, a mark can be formed as a specific portion within the chip. In place of forming a mark, the pattern of a line extending between the IC chips, i.e., the pattern of the gap SCL, may be recognized. Alternatively, if the position data of the central point P1 is to be obtained, a point where the lines intersect may be recognized, and if the position data of the points P2 to P5 at the end portions are to be obtained, portions where the lines are disconnected may be recognized.

Regarding recognition of the points P1 to P5, for example, the table 41 is moved by the operator while observing the CRT screen so that the focal point of the second image pickup means 7 sequentially coincides with the points P1 to P5, and the obtained images are stored in the image memory. At the same time, the movement pattern of the table 41 is stored in the image memory, thus performing teaching. When the wafer is to be measured, the second image pickup means 7 is set in the low magnification mode, and the table 41 is moved in accordance with the pre-taught movement pattern to be close to the respective points. An image pickup operation is performed in the wide range on the wafer, as shown in FIG. 9A, and coarse alignment is performed based on the obtained image and the pre-taught image. Subsequently, an image pickup operation is performed in a narrow range in the high magnification mode, as shown in FIG. 9B, and fine alignment is performed.

The above description does not consider alignment of the table 41 in the θ direction (circumferential direction). However, when considering an error between the direction along which the probes are aligned and a direction along which the IC chips are aligned, the error of the table 41 in the θ direction can be obtained from the two points, of the five points, and the table 41 can be moved in the θ direction (FIG. 13, step S25). Note that since pre-alignment (alignment of the orientation flat) has been performed before the wafer W is placed on the table 41, the positional error in the θ direction is very small. After alignment in the θ direction is performed, images of the five points P1 to P5 are picked up, and the five wafer coordinate points (Xw1,Yw1,Zw1), (Xw2,Yw2,Zw2), (Xw3,Yw3,Zw3), (Xw4,Yw4,Zw4), and (Xw5,Yw5,Zw5) of the respective points within the XYZ coordinate system of the XYZ stage 4 (table 41) are stored in the memory 83 (FIG. 13, step S30). For the sake of descriptive convenience, the respective coordinate points will be represented by a wafer coordinate point (Xw,Yw,Zw). This method is performed for aligning the two image pickup means 6 and 7 described above in the same manner.

The second image pickup means 7 is retreated from below the probes 50, as shown in FIG. 7A, and the XYZ stage 4 is moved in the X, Y, and Z directions so that the focal point of the second image pickup means 7 is located at a predetermined probe 50. The position of the XYZ stage 4 obtained at this time is stored as the probe coordinate point (Xp,Yp,Zp) in the memory 83 (FIG. 13, step S10). In this case, images of the probes 50 are picked up with the camera 61 adjacent to the second image pickup means 7 in the same manner as described above. This operation corresponds to the probe image pickup step S10 described above.

When the above operations are performed, as the focal points of the first and second image pickup means 6 and 7 are aligned, images of the wafer W and the probes 50 are picked up by a common image pickup means in a way. If only the second image pickup means 7 is used, an error is undesirably included in setting the relative positions of the second image pickup means 7 and the probes 50. However, in this embodiment, the relative positions of the five points P1 to P5 on the wafer W and the probes 50 can be precisely obtained.

Figure 15:
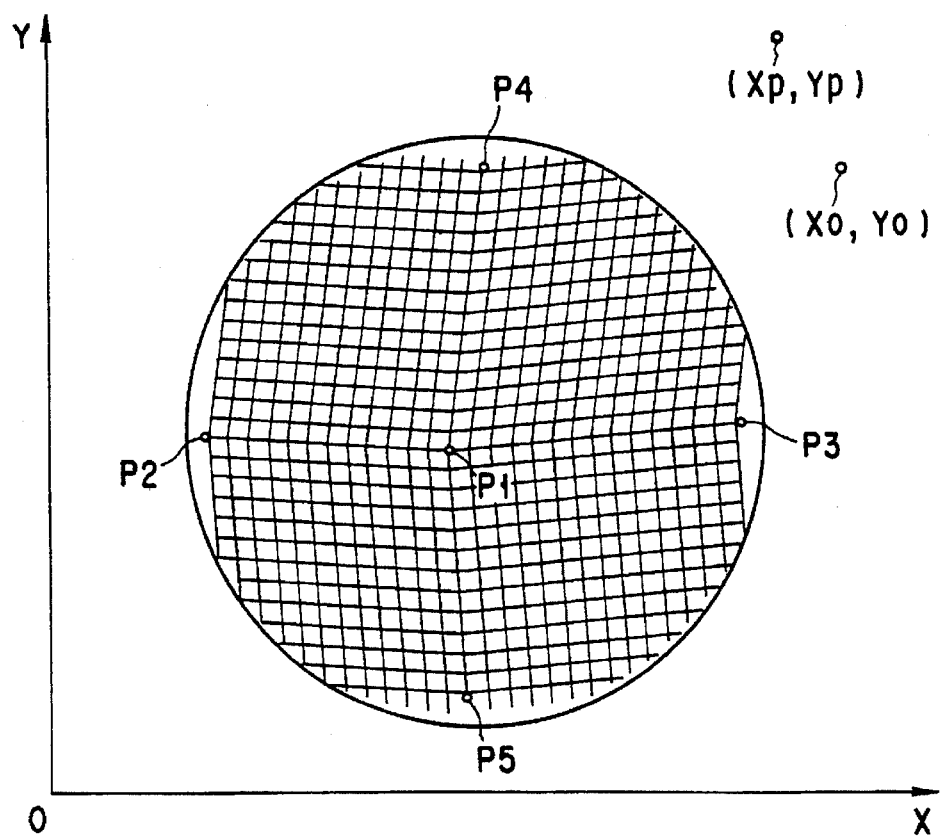
FIG. 15 is a view showing the concept of the five coordinate points shown in FIG. 14, a reference coordinate point for alignment of first and second image pickup means, and a probe coordinate point, in the coordinate system of the XYZ stage.

FIG. 15 shows the concept of the five points P1 to P5 on the wafer, the reference coordinate point (X0,Y0) where the optical axes of the image pickup means 6 and 7 coincide with each other, the coordinate point (Xw,Yw) of the corresponding reference electrode pad in, e.g., five chips, and the coordinate point (Xp,Yp) of the reference probe 50 in the XY coordinate system managed by the control and processing section 81 to 84. In FIG. 15, a circle mark at the central portion of the wafer indicates the image pickup position of the central point of the wafer when the ball screw and the like are in an ideal condition. The points P1 to P5 can be set to accurately coincide with the positions of the corresponding probes by obtaining their positions relative to the probes 50. If an accumulated error including an error in orthogonality and linearity of the X-, Y-, and Z-direction ball screws and guides for moving the table 41, an error due to expansion and contraction caused by a change in environmental temperature, and the like exists, the coordinate point of, e.g., the point P1 in the memory 83 is not necessarily located at the center between the coordinate points P2 and P3, and the points P1, P2, and P3 are not necessarily aligned on a straight line. Namely, the accumulated error is reflected to appear in the coordinate points P1 to P5 in the memory 83. FIG. 15 shows this state.

Therefore, according to the present invention, the positions of the respective points in the rectangular coordinate system with reference to the wafer, i.e., with reference to the columns and rows of the IC chip matrix, are developed in the XY coordinate system (this is distorted due to the presence of the accumulated error) of the control and processing section, managed by the pulse count of the encoders of the respective motors in the X, Y, and Z directions based on the position information of the points P1 to P5. In FIG. 15, a coordinate space surrounded by the points P1, P2, and P4 on the wafer is developed on the XY coordinate system of the control and processing section based on the position information of the points P1, P2, and P4. More specifically, the respective points of a region surrounded by the points P1, P2, and P4 on the wafer are determined on the XY coordinate system of the control and processing section. As a scheme for this, for example, a straight line P1–P2 is divided by straight lines parallel to a straight line P1–P4 at a plurality of points, i.e., at portions corresponding in number to the IC chips, and the straight line P1–P4 is divided by straight lines parallel to the straight line P1–P2 at a plurality of points, i.e., at portions corresponding in number to the IC chips. The coordinate points of specific corners of the respective IC chips in the coordinate system are obtained, and the positions of the electrode pads of the respective chips are obtained from these coordinate points. This is merely an example, and coordinate conversion of the positions of the electrode pads may be performed in accordance with other methods. Concerning the other three regions surrounded by the points P1, P3, and P4, the points P1, P3, and P5, and the points P1, P2, and P5, the coordinate points of the electrode pads in the coordinate system of the control and processing section can be obtained in the same manner.

Figure 16:
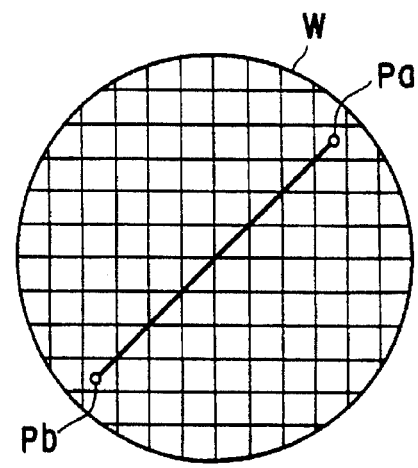
FIG. 16 is a plan view showing the positions of two points when their coordinate points are obtained by picking up images of the two points on the wafer.

In the present invention, to develop the arrangement of the chips on the wafer on the coordinate system of the control and processing section, it may be performed based on the other four points excluding the central point p1 of the wafer. Alternatively, in place of dividing the wafer into four regions as described above, the wafer may be divided into a large number of portions in the vertical and horizontal directions, and the positions of the respective lattice points may be determined. Furthermore, as shown in FIG. 16, the coordinate points of positions Pa and Pb (namely, two points) at the two ends of a straight line inclined at 45° with respect to the direction of IC the chip array may be obtained, and coordinate development described above may be performed based on the obtained coordinate points, although the precision will be lower than in the above example.

When the coordinate points of the specific portions of the respective chips, e.g., the reference electrode pads, are obtained in this manner, the corresponding data is stored in the memory 83 shown in FIG. 5. A moving amount necessary for moving the XYZ stage 4 from the reference coordinate point to a position, where the reference electrode pad and the reference probe are brought into contact with each other, is calculated by the central processing unit 82, and is stored in the memory 83 (FIG. 13, step S38). Assuming that the moving amounts in the X, Y, and Z directions are respectively $x$, $y$, and $z$, these moving amounts are expressed as x=Xw+Xp−X0, y=Yw+Yp−Y0, and z=Zw+Zp−Z0. FIG. 17 shows the concept of this calculation. The distance between the probe and the wafer in the Z direction is the sum of the upward moving amount of the first image pickup means 6 when it picks up the probe images, and the upward moving amount of the second image pickup means 7 when it picks up the wafer image, from the position of the target obtained when the focal points of the image pickup means 6 and 7 are aligned.

Thereafter, the respective motors in the X, Y, and Z directions are controlled by the motor control unit 84 based on the moving amount data in the memory 83, thereby moving the table 41. The electrode pads on the wafer W are thus sequentially brought into contact with the probes 50, thereby performing electrical testing by the tester 55 (FIG. 13, step S40).

As described above, since the focal point of the first image pickup means 6 for picking up the probe images and the focal point of the second image pickup means 7 for picking up the wafer image are aligned and that the images of the probes and the wafer are thus picked up by a common image pickup means in a way, the accurate relative positions of the points and the probes can be determined on the wafer. The coordinate points of at least two points on the wafer, e.g., the central chip of the wafer and four chips near the perimeter of the wafer, in the coordinate system of the control and processing section are obtained. In this manner, since the positions on the wafer are developed as the coordinate points in the coordinate system of the control and processing section, even if an accumulation error including expansion and contraction of the ball screws, the machining precision of the guides, and the like exists in the driving system of the XYZ stage 4, alignment of the electrode pads and the probes can be performed accurately. As a result, high-precision electrical testing can be performed.

Assume that the ball screw in the X direction expands. As shown in FIG. 18, when the ball screw has not expanded, the relationship between the pulse count of the encoder and the moving distance is expressed by a straight line R1. When, however, the ball screw expands, even if the rotational angle of the encoder remains the same, the moving distance increases, so that the relationship between the pulse count and the moving distance is expressed by a straight line R2. Namely, the pulse count required for moving the ball screw by a length corresponding to one chip decreases from PLn to PLk. Accordingly, when coordinate development as described above is performed, a correspondence can be obtained between the positions of the respective pads and the pulse counts of the encoders of the driving system at this time, so that alignment of the electrode pads and the probes can be accurately performed.

When the probes and the electrode pads are aligned in the Z direction, they can be accurately brought into contact with each other even if the ball screw is shifted in the vertical direction. In the present invention, alignment in the Z direction can be performed in accordance with other methods as well. The first image pickup means may be provided to the wafer table (in this case, the first image pickup means is provided to the XYZ stage through the table).

How to operate the marker 9 will be described.

An IC chip, which is determined as defective by the tester 55 as the result of the test of the electrical characteristics, is marked by the marker 9. Thus, the test result is stored in the data storage of the tester 55 or in the memory 83. This marking step is executed after a certain chip is determined as defective and before the next chip is measured, or after measurement of all the chips on one wafer W is completed.

In the present invention, in order to avoid erroneous marking on a different chip, the position of the distal end of the nozzle 91 of the marker 9 is stored in advance as the marker coordinate point in the memory 83. A marker image pickup step for this is preferably performed continuously just before or just after the probe image pickup step S10 described above.

More specifically, as shown in FIG. 19A, the XYZ stage 4 is moved to move the first image pickup means 6 to below the nozzle 91, the position of which is roughly known in advance. Furthermore, search is performed such that the field of view of the first image pickup means 6 captures the distal end of the nozzle 91, and the position where the first image pickup means 6 captures the distal end of the nozzle 91 is image-recognized by the first image pickup means 6. More specifically, an image pickup operation is performed in a wide range in the low magnification mode first, and thereafter in a narrow range in the high magnification mode.

The position of the distal end of the image-recognized nozzle 91 is set at the center of the screen, i.e., at the focal point of the first image pickup means 6. As a result, the position of the XYZ stage 4 obtained when the distal end of the nozzle 91 is captured at the center of the screen is defined as the marker coordinate point (Xm,Ym,Zm) of the XYZ stage 4 in the three-dimensional coordinate system, and is stored in the memory 83. The schematic position data of the distal end of the nozzle 91 required for automatically moving the XYZ stage 4 is stored in the memory 83 in advance.

The central processing unit 82 receives address information of the defective IC chip from the tester 55, and recognizes which chip on the wafer W is defective. Based on the reference coordinate point, the coordinate point of the defective chip, and the marker coordinate point of the XYZ stage 4 in the three-dimensional coordinate system and, if necessary, the current coordinate point of the XYZ stage 4, the moving amount of the XYZ stage 4 is calculated. Subsequently, the XYZ stage 4 is moved so that the defective chip comes to immediately under the nozzle 91 of the marker 9, as shown in FIG. 19B. Then, an ink is applied on the defective chip by the nozzle 91 in accordance with, e.g., dropping, thereby forming a mark M as shown in FIG. 20.

In this manner, the relative positions of the respective chips on the wafer W, the probes 50, and the distal end of the nozzle 91 with respect to each other can be precisely obtained. Accordingly, a defective chip can be automatically and reliably marked. As a result, a cumbersome marking operation conventionally performed by the operator need not be performed. A non-defective chip will not be erroneously marked, and accordingly a defective chip will not be erroneously sent as a non-defective chip to subsequent steps.

As described above, in the probe system according to the present invention, the first image pickup means 6 adjacent to the target 63 and the second image pickup means 7 located at a position higher than the upper surface of the wafer are aligned by the target 63 which can be set at the forward position with a high reproducibility. The focal point of the first image pickup means 6 is preset to coincide with the reference point of the target 63. Accordingly, the focal points of the first and second image pickup means 6 and 7 can be converted into coordinate points of the XYZ stage 4 in the three-dimensional coordinate system without being influenced by the absolute precision of the XYZ stage 4, thermal deformation, and the like.

Since the second image pickup means 7 can be moved to under the probe card 5, the moving mechanism of the XYZ stage 4 can be greatly decreased in size, thereby down-sizing the apparatus. Since the use position of the second image pickup means 7 is detected for each of wafers, alignment of the probes with the wafer is not influenced by the reproducibility of the driving mechanism of the second image pickup means 7.

The focal point of the first image pickup means 6 for picking up the probe images and the focal point of the second image pickup means 7 for picking up the wafer image are aligned, and the images of the probes 50 and the wafer W are picked up with a common image pickup means in a way. Thus, the accurate relative positions of points on the wafer and the probes can be obtained. Then, the coordinate point of a point on the wafer, e.g., a chip, and preferably a plurality of points on the wafer, in the coordinate system of the control and processing section is obtained. Since the positions of the points on the wafer are processed as the coordinate points in the coordinate system of the control and processing section in this manner, even if an accumulated error exists in the driving mechanism of the table, including, e.g., the expansion and contraction of the ball screws or machining precision of the guides, alignment of the probes and the wafer can be accurately performed.

More specifically, when the probe coordinate point of a specific portion of the probe card 5 and the wafer coordinate point of a corresponding specific portion of a chip on the wafer W are obtained relative to each other, even if a feed error occurs in the moving mechanism of the XYZ stage 4 due to a temperature change or distortion, the XYZ stage 4 can be moved with a feed amount corresponding to the error. For example, the temperature of the probe system may change, and the temperature of the moving mechanism of the XYZ stage 4 may increase to about 30° C. Also, when a test head having a large weight is mounted, the entire probe system may be distorted. The mounting position of the probe card 5 may be slightly displaced, or the relative positions of the probes 50 and the wafer chip may be displaced by thermal expansion and contraction.

When the position of the distal end of the nozzle 91 of the marker 9 is stored as the marker coordinate point in the memory 83 in advance, a defective chip can be automatically and reliably marked.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of detecting a coordinate point of a chip in a probe system for testing electrical characteristics of a plurality of chips arranged in a matrix on a substrate, said system comprising:

a probe card on which a plurality of probes are disposed to be brought into contact with the chips, a tester for exchanging an electrical signal with the chips through said probes, a stage arranged to oppose said probe card and movable in directions of two-dimensional axes, a table which is supported on said stage to be rotatable within a horizontal plane, and adapted to place the substrate thereon, image pickup means, disposed above said table such that a field of view thereof faces downward, for picking up an image of the substrate, a target supported by said stage and having a reference point to be aligned with an optical axis of said image pickup means, and a control and processing section connected to said table, said stage, and said image pickup means, so as to control operations thereof, and to process and store signals therefrom, said control and processing section serving to recognize a position of said stage in the directions of the two-dimensional axes based on a two-dimensional coordinate system defined by operation signals exchanged between said control and processing section and said stage, and said method comprising:

a step of inputting a design map of the matrix of the chips in said control and processing section;

an aligning step of aligning the optical axis of said image pickup means with said reference point, and storing a position of said stage obtained at this time, as a reference coordinate point of the optical axis of said image pickup means in the two-dimensional coordinate system, in said control and processing section;

a substrate image pickup step of moving said stage by said control and processing section based on the design map, capturing respective specific portions of first, second and third chips selected from said plurality of chips within the field of view of said image pickup means, setting the specific portions to coincide with the optical axis of said image pickup means, and storing positions of said stage obtained at these time, as first, second and third coordinate points of the respective specific portions of the first, second and third chips in the two-dimensional coordinate system, in said control and processing section, where the first and second chips belong to the same row of the matrix while the first and third chips belong to the same column of the matrix, and the respective specific portions of the first, second and third chips have identical positional relationship with the first, second and third chips; and a calculation step of calculating, by said control and processing section, coordinated points of chips located between the first and second chips, and between the first and third chips, in the two-dimensional coordinate system based on the first, second and third coordinate points in accordance with proportional distribution.

2. The method according to claim 1, wherein said specific portions of the first, second and third chips correspond to reference electrode pads of the first, second and third chips, respectively.

3. The method according to claim 1, wherein said image pickup means is located at a use position located under said probe card in the aligning step and in the substrate image pickup step, and said image pickup means is movable in the horizontal direction so as to move to and from said use position.

4. The method according to claim 1, wherein said substrate image pickup step further comprises a step of moving said stage by said control and processing section based on the design map, capturing respective specific portions of fourth and fifth chips within the field of view of said image pickup means, setting the specific portions to coincide with the optical axis of said image pickup means, and storing positions of said stage obtained at this time, as fourth and fifth coordinate points of the respective specific portions of the fourth and fifth chips in the two-dimensional coordinate system, in aid control and processing section, where the second and fourth chips belong to the same row of the matrix with the first chip interposed therebetween while the third and fifth chips belong to the same column of the matrix with the first chip interposed therebetween, and the respective specific portions of the first to fifth chips have identical positional relationship with the first to fifth chips, and wherein said calculation step further comprises a step of calculating, by said control and processing section, coordinated points of chips located between the first and fourth chips, and between the first and fifth chips, in the two-dimensional coordinate system based on the first, fourth and fifth coordinate points in accordance with proportional distribution.

5. A probe method in a probe system for testing electrical characteristics of a plurality of chips arranged in a matrix on a substrate, said system comprising, a probe card on which a plurality of probes are disposed to be brought into contact with the chips, a tester for exchanging and electrical signal with the chips through said probes, a stage arranged to oppose said probe card and movable in directions of three-dimensional axes, a table which is supported on said stage to be rotatable within a horizontal plane, and adapted to place the substrate thereon, first image pickup means, mounted on said stage such that a field of view thereof faces upward, for picking up an image of said probes, second image pickup means, disposed above said table such that a field of view thereof faces downward, for picking up an image of the substrate, a target supported by said stage and having a reference point used for aligning focal points and optical axes of said first and second image pickup means, and a control and processing section connected to said table, said stage, and said first and second image pickup means, so as to control operations thereof, and to process and store signals therefrom, said control and processing section serving to recognize a position of said stage in the directions of the three-dimensional axes based on a three-dimensional coordinate system defined by operation signals exchanged between said control and processing section and said stage, and said method comprising:

a step of inputting a design map of the matrix of the chips in said control and processing section;

a probe image pickup step of capturing a specific portion of said probes within the field of view of said first image pickup means and setting the specific portion to coincide with the focal point of said first image pickup means, and storing a position of said stage obtained at this time, as a probe coordinate point of the specific portion of said probes in the three-dimensional coordinate system, in said control and processing section;

an aligning step of causing the focal points and optical axes of said first and second image pickup means to coincide with each other through said reference point, and storing a position of said stage obtained at this time, as a reference coordinate point of the focal points of said first and second image pickup means in the three-dimensional coordinate system, in said control and processing section;

a substrate image pickup step of moving said stage by said control and processing section based on the design map, capturing respective specific portions of first, second and third chips selected from said plurality of chips within the field of view of said second image pickup means, setting the specific portions to coincide with the focal point of said second image pickup means, and storing positions of said stage obtained at this time, as first, second and third coordinate points of the respective specific portions of the first, second and third chips in the three-dimensional coordinate system, in said control and processing section, where the first and second chips belong to the same row of the matrix while the first and third chips belong to the same column of the matrix, and the respective specific portions of the first, second and third chips have identical positional relationships with the first, second and third chips;

a calculation step of calculating, by said control and processing section, coordinated points of chips located between the first and second chips, and between the first and third chips, in the three-dimensional coordinate system based on the first, second and third coordinate points in accordance with proportional distribution; and a test step of calculating a necessary moving amount of said stage by said control and processing section from the probe coordinate point, the reference coordinate point, and the first to third coordinate points, and bridging the chips into contact with said probes by operating said stage based on the calculated moving amount, thereby testing electrical characteristics of the chips.

6. The method according to claim 5, wherein said specific portions of the first, second and third chips correspond to reference electrode pads of the first, second and third chips, respectively.

7. The method according to claim 5, wherein said second image pickup means is located at a use position located under said probe card in the aligning step and in the substrate image pickup step, and said second image pickup means is movable in the horizontal direction so as to move to and from said use position.

8. The method according to claim 5, wherein said substrate image pickup step further comprises a step of moving said stage by said control and processing section based on the design map, capturing respective specific portions of fourth and fifth chips within the field of view of said second image pickup means, setting the specific portions of coincide with the optical axis of said second image pickup means, and storing positions of said stage obtained at these time, as fourth and fifth coordinate points of the respective specific portions of the fourth and fifth chips in the three-dimensional coordinate system, in a said control and processing section, where the second and fourth chips belong to the same row of the matrix with the first chip interposed therebetween while the third and fifth chips belong to the same column of the matrix with the first chip interposed therebetween, and the respective specific portions of the first to fifth chips have identical positional relationship with the first to fifth chips, and wherein said calculation step further comprises a step of calculating, by said control and processing section, coordinated points of chips located between the first and fourth chips, and between the first and fifth chips, in the three-dimensional coordinate system based on the first, fourth and fifth coordinate points in accordance with proportional distribution.

9. The method according to claim 7, wherein the probe image pickup step is executed first, said second image pickup means is forwarded to the use position, the aligning step and the substrate image pickup step are executed in that order, said second image pickup means is retreated from the use position, and thereafter the test step is executed.

10. The method according to claim 7, wherein the probe image pickup step is executed first, said second image pickup means is forwarded to the use position, the substrate image pickup step and the aligning step are executed in that order, said second image pickup means is retreated from the use position, and thereafter the test step is executed.

11. The method according to claim 7, wherein said second image pickup means is forwarded to the use position first, the aligning step and the substrate image pickup step are executed in that order, said second image pickup means is retreated from the use position, the probe image pickup step is executed, and thereafter the test step is executed.

12. The method according to claim 7, wherein said second image pickup means is forwarded to the use position first, the substrate image pickup step and the aligning step are executed in that order, said second image pickup means is retreated from the use position, the probe image pickup step is executed, and thereafter the test step is executed.

* * * * *